United States Patent
Prasidh et al.

(10) Patent No.: US 8,244,192 B2
(45) Date of Patent: Aug. 14, 2012

(54) SYSTEM AND METHOD FOR WIRELESS COMMUNICATION OF MAGNETIC RESONANCE DATA

(75) Inventors: Ramabadran Prasidh, Karnataka (IN); Kumar Santosh, Karnataka (IN); Boskamp Eddy, Waukesha, WI (US)

(73) Assignee: General Electric Company, Schenectady, NY (US)

(*) Notice: Subject to any disclaimer, the term of this patent is extended or adjusted under 35 U.S.C. 154(b) by 309 days.

(21) Appl. No.: 12/625,843

(22) Filed: Nov. 25, 2009

(65) Prior Publication Data
US 2011/0124301 A1 May 26, 2011

(51) Int. Cl.
*H04B 1/034* (2006.01)

(52) U.S. Cl. ........ 455/110; 455/41.1; 455/41.3; 455/42; 455/43; 455/45; 324/307; 324/309

(58) Field of Classification Search .......... 455/110, 455/41.1, 41.3, 42, 43, 45; 324/307, 309
See application file for complete search history.

(56) References Cited

U.S. PATENT DOCUMENTS

| | | | |
|---|---|---|---|
| 4,682,106 A * | 7/1987 | Vatis et al. | 324/307 |
| 5,319,309 A * | 6/1994 | den Boef et al. | 324/309 |
| 6,791,322 B2 | 9/2004 | Vester | |
| 7,123,009 B1 | 10/2006 | Scott | |
| 7,323,876 B2 | 1/2008 | Den Boef | |
| 2003/0206019 A1 | 11/2003 | Boskamp | |
| 2008/0259897 A1* | 10/2008 | Van Helvoort et al. | 370/345 |
| 2009/0237077 A1* | 9/2009 | Vaughan | 324/307 |

* cited by examiner

*Primary Examiner* — Sanh Phu
(74) *Attorney, Agent, or Firm* — The Small Patent Law Group; Dean D. Small

(57) ABSTRACT

In one embodiment, a method of wirelessly transmitting magnetic resonance (MR) data is provided. The method comprises steps of obtaining at least one MR signal having a Larmor frequency from a radio frequency (RF) channel in an RF coil, the RF coil comprising multiple RF channels, each RF channel associated with a single imaging element, generating a modulation signal based on the MR signal, generating a carrier signal with a predetermined frequency, the predetermined frequency being associated with the RF channel and using the modulation signal to phase modulate the carrier signal to form a phase-modulated signal.

24 Claims, 8 Drawing Sheets

SYSTEM AND METHOD FOR WIRELESS COMMUNICATION OF MAGNETIC RESONANCE DATA

FIELD OF INVENTION

The invention generally relates to a magnetic resonance imaging (MRI) apparatus and more particularly to a device and method for wirelessly transmitting an analog magnetic resonance (MR) signal from a radio frequency (RF) coil of an MRI apparatus to a receiver that is spatially separated from the RF coil.

BACKGROUND OF THE INVENTION

In a typical MRI apparatus, an RF coil is typically used to sense the imaging information. The RF coil comprises a number of imaging elements and receive coils corresponding to the imaging elements. The RF coil is connected to one or more image reconstruction engines through a number of co-axial cables depending on the number of receive coils and imaging elements in the RF coil. The proximity of the receive coils and cables with one another can lead to ghosting, low signal to noise ratio and even standing waves at times. These become more significant in multi-RF channel parallel imaging applications.

A viable solution to the issues listed above would be to eliminate the co-axial cables running between the receive coils and the image reconstruction engine thereby employing wireless transmission of MR data between the RF (receive) coil and the image reconstruction engine. There have been experiments on transmission of MR data by wireless means using amplitude modulation, direct frequency modulation and digital modulation techniques.

The integrity of the MR signal's amplitude and phase sensed by the receive coil needs to be preserved for accurate reconstruction of the image. One limitation associated with amplitude modulation is, an amplitude-modulated signal is most susceptible to noise, amplitude and phase non-linearities of active semiconductor devices involved in the amplifier and mixer stages.

On the other hand, frequency modulation is less susceptible to RF channel noise, amplitude and phase non-linearities as the demodulator's fidelity depends largely on frequency variations. However, the frequency modulation technique consumes a huge bandwidth. Another limitation associated with frequency modulation is, implementation of direct frequency modulation may require high stable and monotonic voltage controlled oscillators (VCOs). In addition it may be necessary to include frequency stabilization circuits, such as a closed loop frequency control system, to ensure that the modulation of the VCO does not render its frequency unstable. Further, the modulation index could be different for different centre frequencies of the VCO.

Yet another option of using digital modulation would require a high dynamic range Analog To Digital Converter (ADC) on each RF channel with associated sampling circuits, sampling clock circuits and other relevant digital circuits on the RF coil. One limitation associated with this technique is, the process of sampling and conversion of the MR signal to equivalent digital information may be time consuming.

Another limitation associated with the digital modulation technique is, because the analog-to-digital converter has a finite dynamic range, substantial amplitude distortion in the receive chain can result in overloading the analog-to-digital converter producing a clipped digital signal or otherwise erroneous digitized data. Similarly, when the signal is at lower end of the dynamic digitizing range, the digitizing process can introduce substantial digitization noise.

It is therefore necessary to build a communication architecture that can have high fidelity of reproduction of modulation signal with high frequency stability, insusceptible to external electromagnetic interferences, feasible and economical to build in large numbers and easy to maintain.

BRIEF DESCRIPTION OF THE INVENTION

The above-mentioned shortcomings, disadvantages and problems are addressed herein which will be understood by reading and understanding the following specification.

In one embodiment, a method of wirelessly transmitting Magnetic resonance (MR) data is provided. The method comprises steps of obtaining at least one MR signal having a Larmor frequency from a radio frequency (RF) channel in an RF coil, generating a modulation signal based on the MR signal, generating a carrier signal with a predetermined frequency, the predetermined frequency being associated with the RF channel and using the modulation signal to phase modulate the carrier signal to form a phase-modulated signal.

In another embodiment, a method of communicating MR data is provided. The method comprises steps of wirelessly transmitting at least one phase-modulated signal, receiving the phase-modulated signal at a receiver with a plurality of antennas, selecting the phase-modulated signal from at least one of the plurality of antennas for demodulation in the receiver, down converting the phase-modulated signal to obtain an intermediate frequency signal, demodulating the intermediate frequency signal by applying the intermediate frequency signal to a demodulator and supplying the demodulated signal to a digitizer for processing image information.

In yet another embodiment, a computer readable program stored in computer readable media, the computer readable program comprising instructions for executing a method of communicating MR data is provided. The instructions comprise a routine for wirelessly transmitting at least one phase-modulated signal, a routine for sensing the transmitted phase-modulated signal by a receiving antenna, a routine for amplifying the received phase-modulated signal to boost signal strength, a routine for down converting the amplified phase-modulated signal to obtain an intermediate frequency signal, a routine for demodulating the intermediate frequency signal by applying the intermediate frequency signal to a demodulator and a routine for supplying the demodulated signal to a digitizer for processing image information.

In yet another embodiment, an RF module for an MRI apparatus for communicating MR data is provided. The RF module comprises a transmitter configured for transmitting a wideband phase-modulated signal comprising the MR data and a receiver wirelessly connected to the transmitter and configured to receive the phase-modulated signal for subsequent data processing and image reconstruction. The transmitter comprises an RF switch array configured to support sequential excitation of one or more RF channels to obtain an MR signal, a local oscillator configured to convert the MR signal obtained at Larmor frequency to a frequency-converted signal having an intermediate frequency, a fixed frequency oscillator for generating a carrier signal with a predetermined frequency, the predetermined frequency being associated with the RF channel, a modulator configured for phase modulating the carrier signal using the frequency-converted signal to form a phase-modulated signal and a harmonic generator for multiplying the frequency of the phase-modulated signal by a first predetermined factor.

In yet another embodiment, an RF module for an MRI apparatus for communicating MR data is provided. The RF module comprises a transmitter configured for transmitting a phase-modulated signal comprising the MR data and a receiver wirelessly connected to the transmitter and configured for receiving the phase-modulated signal for subsequent data processing and image reconstruction. The transmitter comprises a programmable frequency oscillator configured to provide a reference signal, a channel splitter coupled to the programmable frequency oscillator, the channel splitter configured to supply the reference signal to multiple RF channels, an array of direct digital synthesizers (DDS) coupled to the channel splitter, each DDS in the array of DDS associated with a single RF channel and configured to generate a fixed frequency carrier signal based on the reference signal, the fixed frequency corresponding to the associated RF channel, an array of modulators coupled to the array of DDS, each modulator in the array of modulators coupled to a single DDS and configured to modulate the fixed frequency carrier signal generated at the DDS to form a phase-modulated signal, an array of harmonics generators coupled to the array of modulators, each harmonic generator in the array of harmonic generators configured to multiply the phase-modulated signal in frequency by a first predetermined factor and a channel combiner coupled to the array of harmonic generators, the channel combiner configured to combine one or more outputs from the array of harmonic generators.

Systems and methods of varying scope are described herein. In addition to the aspects and advantages described in this summary, further aspects and advantages will become apparent by reference to the drawings and with reference to the detailed description that follows.

DETAILED DESCRIPTION OF THE INVENTION

In the following detailed description, reference is made to the accompanying drawings that form a part hereof, and in which is shown by way of illustration specific embodiments, which may be practiced. These embodiments are described in sufficient detail to enable those skilled in the art to practice the embodiments, and it is to be understood that other embodiments may be utilized and that logical, mechanical, electrical and other changes may be made without departing from the scope of the embodiments. The following detailed description is, therefore, not to be taken in a limiting sense.

Typically, an MRI apparatus comprises a patient positioning system for positioning a subject to be scanned within a bore of magnet assembly for magnetic resonance (MR) data acquisition, a uniform magnetic field generator for impressing a polarizing magnetic field about the bore of the magnet and an RF magnetic field generator for exciting nuclei in the subject. The MRI apparatus further comprises an RF coil for sensing signals resulting from the excited nuclei in the subject. The RF coil comprises multiple RF channels and each RF channel is associated with a single imaging element. The MRI apparatus further comprises an RF module coupled to the RF coil.

Figure 1:
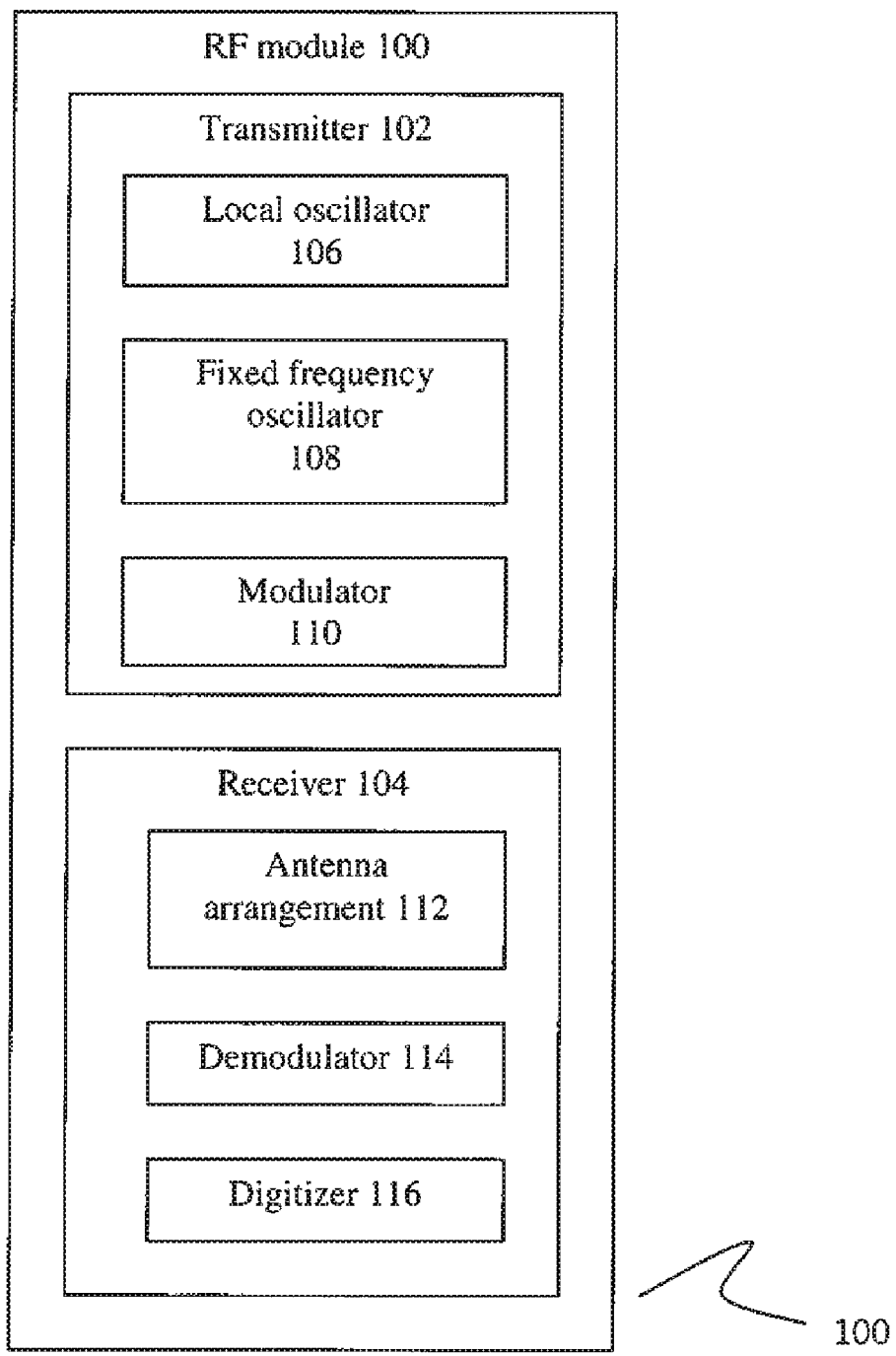
FIG. 1 shows a block diagram of an RF module in an MRI apparatus as described in one embodiment.

In one embodiment shown in FIG. 1, a wireless RF module 100 incorporated into the MRI apparatus for communicating MR data is provided. The MR data is a term used to describe a bunch of MR signals sensed by the RF coil of the MRI apparatus. The RF module 100 comprises a transmitter 102 configured to modulate a carrier signal with an MR signal and further configured to wirelessly transmit at least one modulated MR signal to a receiver 104, located remotely from the MRI apparatus. The receiver 104 is wirelessly connected to the transmitter 102 and is configured to receive the modulated MR signal for subsequent data processing and image reconstruction.

The MR signal sensed by the RF coil is typically at a Larmor frequency. The Larmor frequency for a typical application (basic magnetic field 1.5 T, detection of water or hydrogen) amounts, for example, to 63.6 MHz. The transmitter 102 comprises a local oscillator 106 configured to convert the MR signal obtained at the Larmor frequency to a frequency-converted signal having an intermediate frequency. The process of converting the MR signal to the frequency-converted signal is termed as down conversion. The intermediate frequency is configurable and is typically selected to be in the order of 2 MHz as the overall MR data resides in a band of 1 MHz. The frequency-converted signal thus obtained is used as a modulation signal.

The transmitter 102 further comprises a fixed frequency oscillator 108 for generating a carrier signal with a predetermined frequency. The predetermined frequency is typically associated with a selected RF channel. The fixed frequency oscillator 108 may comprise a high stable Temperature Compensated Crystal Oscillator having a centre frequency at around 100 MHz for example. However, the centre frequency of the fixed frequency oscillator 108 may vary. Accordingly, a fixed frequency oscillator having a centre frequency lower than 100 MHz may also be used depending on the frequency range that is desired. Further, the carrier signal can be synthesized from the temperature compensated crystal oscillator using a direct digital synthesizer or conventional phase locked loop based synthesizer.

The phase of the carrier signal thus generated is modulated using the modulation signal. Accordingly, the transmitter 102 comprises a modulator 110 configured for phase modulating the carrier signal using the frequency-converted signal to form a phase-modulated signal. In one embodiment, the modulator 110 comprises a voltage controlled phase shifter configured for varying the phase of the carrier signal using an external voltage applied via a phase control terminal. In order to obtain the phase-modulated signal, the modulation signal is applied to the phase control terminal of the voltage controlled phase shifter.

In another embodiment, the modulator 110 comprises a combination of at least one quadrature coupler and one or more varactor diodes. The varactor diodes are arranged in series and cathodes of the varactor diodes are tied to a common modulation input terminal through a RFC (Radio Frequency Choke). The modulation signal is applied through the RFC to the cathodes of the varactor diodes.

In yet another embodiment, the modulator 110 comprises a combination of at least one Inductor (L)-Capacitor (C) resonator and one or more varactor diodes. A series or shunt inductor capacitor resonator configuration may be used with the varactor diode (voltage-tunable capacitance) to achieve phase modulation. However, the quadrature coupler based modulator 110 exhibits better predictability of response to modulation.

The transmitter 102 is configured for transmitting the phase-modulated signal to the receiver 104 wirelessly connected to the transmitter 102. The receiver 104 as shown in FIG. 1 comprises an antenna arrangement 112 in wireless communication with the transmitter 102 for receiving the phase-modulated signal, a demodulator 114 coupled to the antenna arrangement 112 for reacquiring the modulation signal from the received phase-modulated signal and a digitizer 116 coupled to the demodulator 114. The digitizer 116 comprises plurality of digital data processing blocks for processing the modulation signal for image reconstruction.

Figure 2:
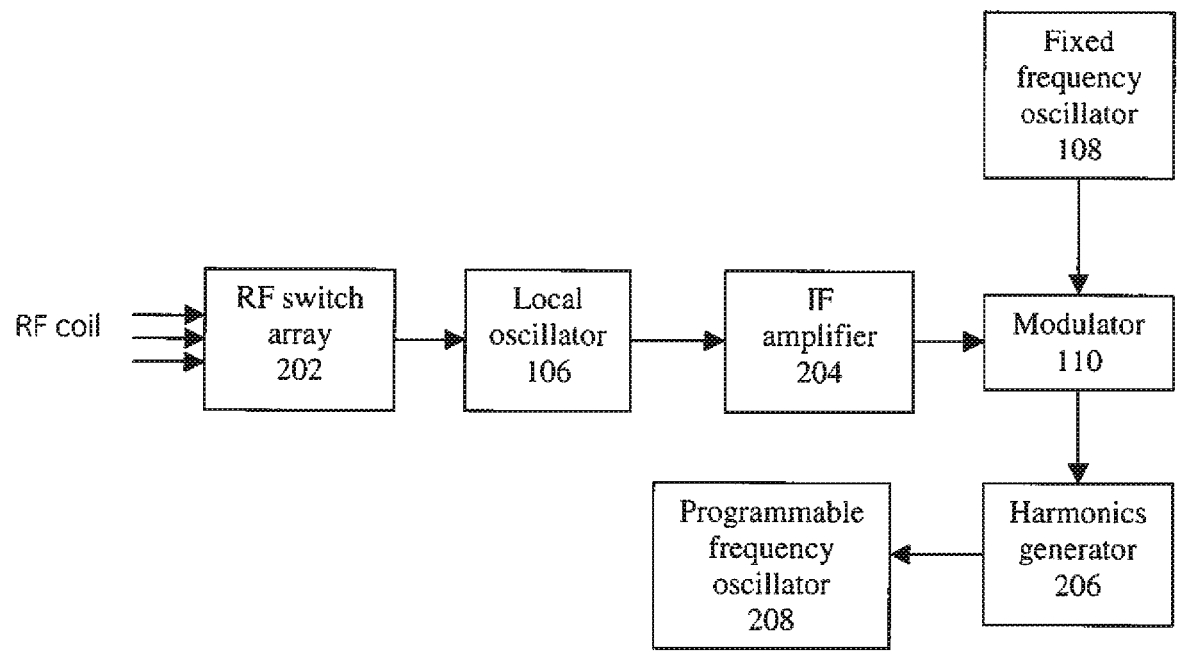
FIG. 2 shows a block diagram representing a transmitter in the RF module of the MRI apparatus as described in one embodiment.

FIG. 2 shows a detailed block diagram of the transmitter 102 as described in another embodiment. Apart from the components shown in conjunction with FIG. 1, the transmitter 102 comprises additional components. The elements, which are the same as or correspond to elements of FIG. 1, are denoted by the same reference numerals, so that in this sense the description need not be repeated and only the differences will be dealt with.

The RF module 100 described herein allows time division multiplexing (TDM) by means of an RF switch array 202 configured to support applications that require sequential excitation of RF channels to obtain the MR data. The transmitter 102 is coupled to one or more receive coils of the RF coil by means of the RF switch array 202. The receive coils are configured to sense the signals emitted by the excited nuclei in the subject. The excitation sequence may be controlled by an end application. In one exemplary embodiment, the RF switch array 202 may be configured to handle excitation of about 64 RF channels.

Further as shown in FIG. 2, the transmitter 102 may comprise an intermediate frequency (IF) amplifier 204 coupled to the local oscillator 106, the IF amplifier 204 being configured to amplify the frequency-converted signal. The IF amplifier 204 comprises a logarithmic amplitude detector and an Automatic Gain Control (AGC) unit coupled to the logarithmic amplitude detector. The logarithmic amplitude detector is configured for generating amplitude control parameters and the automatic gain control unit is configured for adjusting selectable amplification of the IF amplifier 204 based on the amplitude control parameters.

Analog phase modulation of the carrier signal may not produce the desired amount of modulation in a single stage; however, it is more reliable when frequency multipliers are employed. For this reason, the transmitter 102 may further comprise a harmonic generator (also referred to herein as a frequency multiplier) 206 coupled to the modulator 110 for multiplying the frequency of the phase-modulated signal by a first predetermined factor thereby giving rise to a wideband phase-modulated signal. The first predetermined factor can be selected based on the end frequency range that is desired. Typically, the first predetermined factor lies in the range of about 1 to about 100. This accomplishes a desired amount of phase deviation to the phase-modulated signal thereby providing an adequately large spacing between neighboring phase-modulated signals.

At each RF channel, the wideband phase-modulated signal is up converted to a different frequency unique to that RF channel. This accomplishes frequency division multiplexing (FDM) by up converting each RF channel's wideband phase-modulated signal to a different frequency thereby allowing simultaneous transmission of MR signals sensed at various channels.

The phase-modulated carrier signal is up-converted to a frequency in the 2.4 GHz range that represents the RF channel under consideration, using a programmable frequency oscillator 208. The up conversion frequency is driven by the application and band availability. For example, when it is desired to operate the transmitter 102 in the 900 MHz range, a local oscillator generating a carrier signal of 50 MHz frequency may be used in place of a local oscillator generating a carrier signal of 100 MHz frequency. The carrier signal having the 50 MHz frequency is further multiplied by a first predetermined factor of about 10 to obtain a wideband phase-modulated signal having a frequency of 500 MHz. The frequency of the multiplied phase-modulated signal may then be up converted to the 900 MHz range using the programmable frequency oscillator 208. This is further explained in conjunction with FIG. 4.

Figure 3:
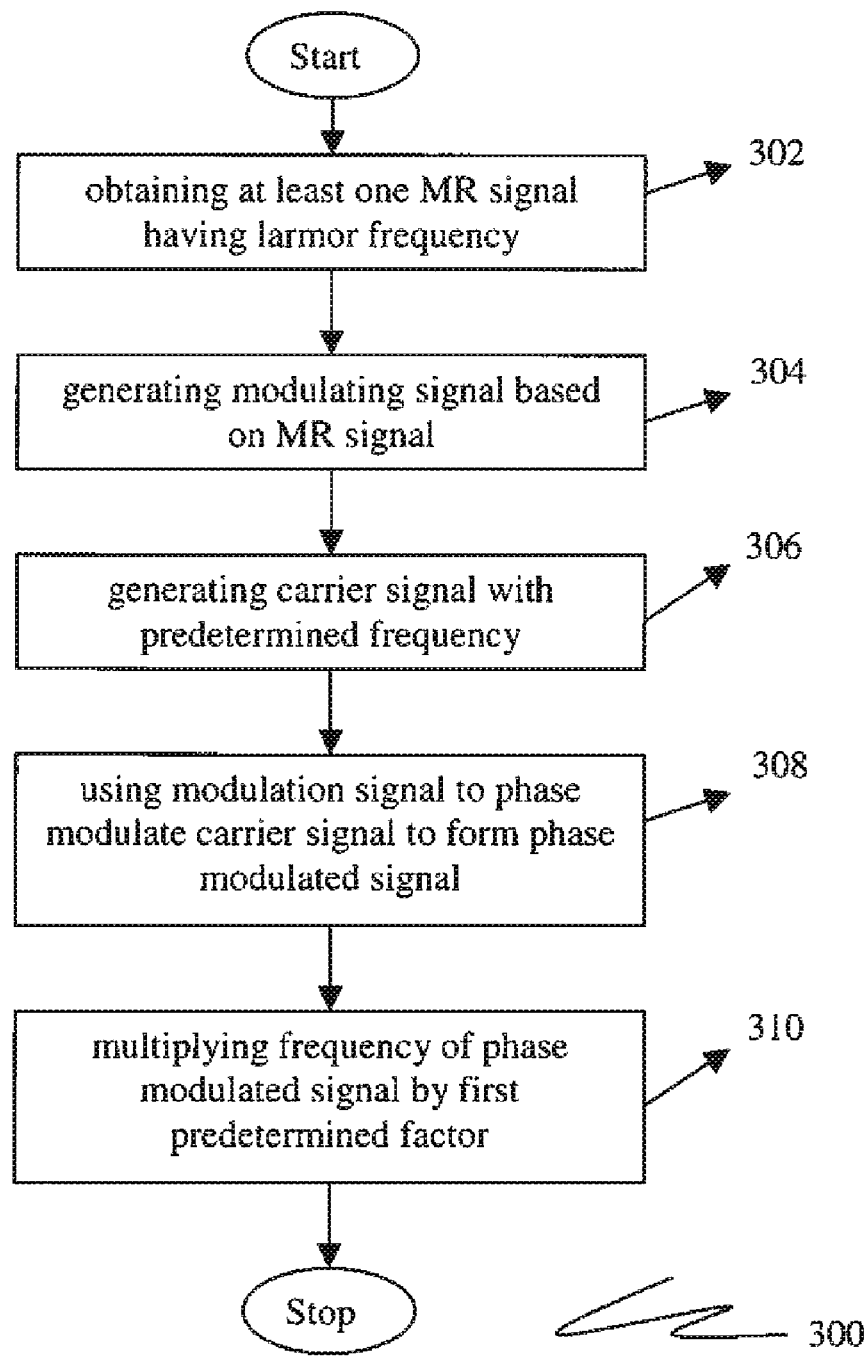
FIG. 3 shows a flow diagram representing a method of transmitting MR data as described in one embodiment.

In one embodiment, shown in FIG. 3, a method 300 of wirelessly transmitting MR data is provided. The method 300 comprises steps of obtaining at least one MR signal having the Larmor frequency at step 302 and generating a modulation signal based on the MR signal at step 304. The method of generating the modulation signal at step 304 comprises converting the MR signal having the Larmor frequency to a frequency-converted signal having an intermediate frequency and using the frequency-converted signal as the modulation signal. In one embodiment, the intermediate frequency is lower than the Larmor frequency and is approximately in the range of about 1 MHz to 3 MHz. The method further comprises generating a carrier signal with a predetermined frequency at step 306 and using the modulation signal to phase modulate the carrier signal to form a phase-modulated signal at step 308. The method 300 further comprises multiplying the frequency of the phase-modulated signal by the first predetermined factor to obtain a wideband phase-modulated signal at step 310.

In one embodiment, the method 300 further comprises frequency division multiplexing the phase-modulated signal. Further the step of frequency division multiplexing comprises using a programmable frequency oscillator to generate a reference signal and configuring an array of direct digital synthesizers to generate multiple fixed frequency carrier signals based on the reference signal. Each fixed frequency carrier signal exhibits a fixed frequency associated with the selected RF channel. This is further explained in conjunction with FIG. 5.

In an alternative embodiment, the method 300 further comprises up converting the wideband phase-modulated signal by a second predetermined factor, the second predetermined factor being associated with the selected RF channel. The second predetermined factor typically lies in the range of about 1 to 100. A combination of an up conversion mixer and a fixed frequency oscillator may be employed for up converting the phase-modulated signal. For this reason, a control input of the programmable frequency oscillator is connected to the modulator 110 and is thereafter supplied with the modulation signal. This is further explained in conjunction with FIG. 4.

Yet another embodiment describes using the programmable frequency oscillator 208 as the carrier generator and further programming the programmable frequency oscillator 208 to generate carrier signals at different frequencies at each RF channel. The carrier signals thus generated at each RF channel are modulated in phase and multiplied in frequency to yield wideband analog phase-modulated signals at frequencies that are different in each RF channel. Each RF channel therefore operates at a unique frequency but simultaneously with other RF channels thereby providing Frequency Division Multiplexing (FDM).

The method 300 further comprises time division multiplexing (TDM) the phase-modulated signal. The time division multiplexing is provided by selecting an RF channel for transmission using the RF switch array 202.

Figure 4:
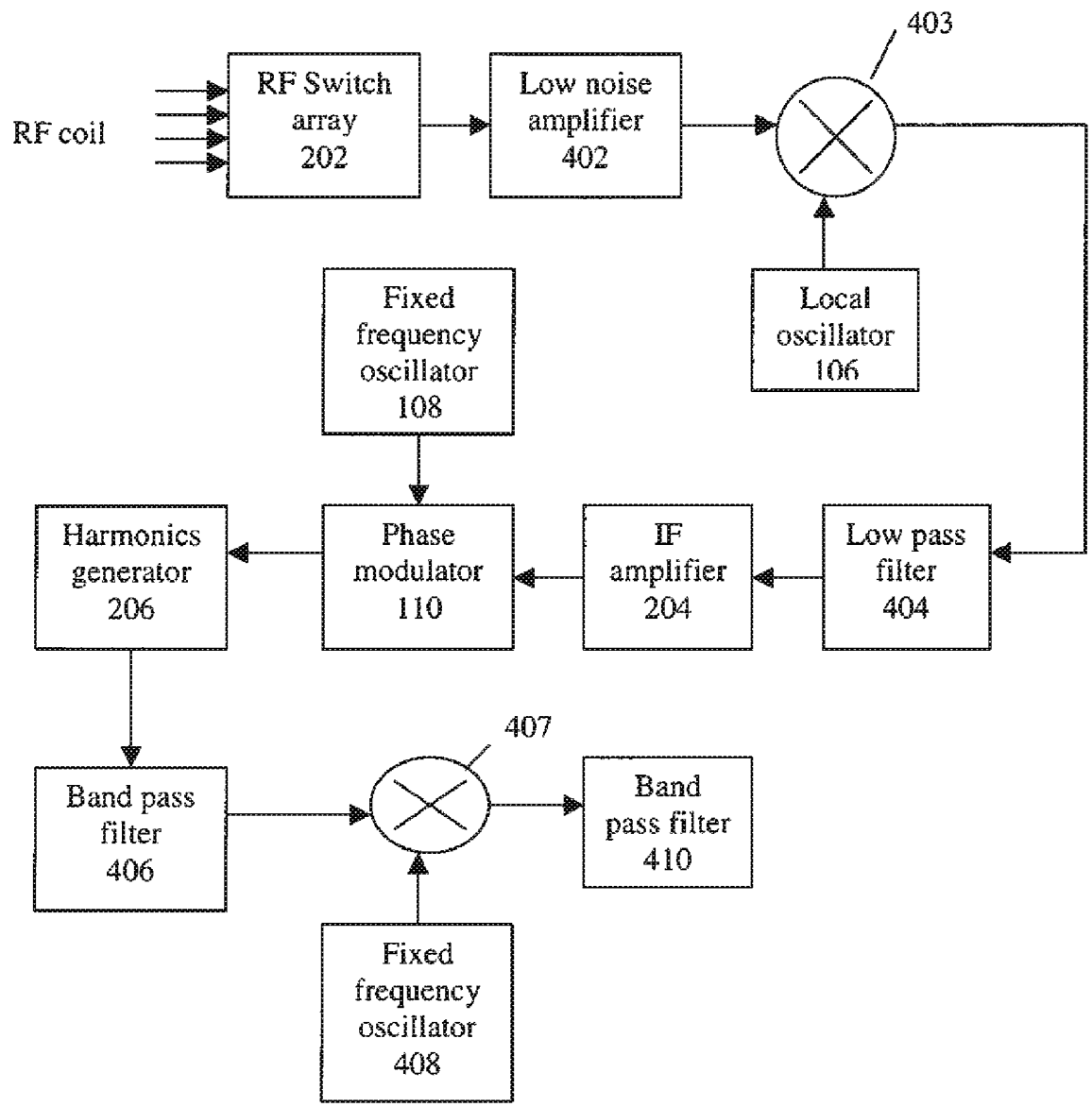
FIG. 4 shows an exemplary block diagram of the transmitter shown in FIG. 2.

FIG. 4 shows an exemplary block diagram of the transmitter 102 as described in one embodiment. Apart from the components described in conjunction with FIG. 2, the transmitter 102 comprises additional components, which will now be described in detail. The RF switch array 202 selects an RF channel coupled to the RF coil for transmission. The selected RF channel is associated with a single receive coil that is configured for sensing MR signals emitted by the excited nuclei. The MR signal thus obtained can be amplified to boost signal strength using a low noise amplifier 402. The MR signal obtained at the Larmor Frequency is initially down-converted to a frequency of about 2 MHz using a mixer 403.

An oscillator signal is supplied to the mixer 403 from the local oscillator 106. The oscillator signal has a local oscillator frequency f that lies in the proximity of the Larmor frequency fL but differs therefrom. A frequency difference f between the local oscillator frequency f and the Larmor frequency fL typically lies between 1 and 3 MHz. The intermediate frequency f is therefore considerably lower than the Larmor frequency fL.

Two frequency signals thus are present at the output of the mixer 403, namely one with the sum of Larmor frequency fL and local oscillator frequency f and one with the difference between Larmor frequency fL and local oscillator frequency f. The sum frequency is filtered out with a low pass filter 404, so that what is now the substantially lower-frequency signal with the difference f (intermediate frequency f) is supplied to the IF amplifier 204, which is then used to modulate the phase of a carrier signal generated by the fixed frequency oscillator 108 having a centre frequency of about 100 MHz.

The analog phase-modulated signal is multiplied in frequency to yield a phase-modulated signal at a higher frequency using one or more harmonics generators 206 (or MMIC based frequency multipliers) thereby achieving wideband analog phase modulation. For example a phase-modulated signal having a frequency of 100 MHz is multiplied by a first predetermined factor of about 10 to obtain a wide band phase-modulated signal of 1 GHz. The wide band phase-modulated signal may be filtered using a band pass filter 406 to eliminate other harmonics. The desired multiple (harmonic) of the phase-modulated signal is drawn through the band pass filter 406. The wideband analog phase-modulated signal thus obtained is either directly amplified and transmitted or up converted to the desired frequency band and then amplified and transmitted depending on the application as illustrated in FIGS. 3 and 2 respectively.

The wideband phase-modulated signal having the frequency 1 GHz is then up converted to a frequency in the range 2.2 to 2.4 GHz using an up conversion mixer 407 and a fixed frequency oscillator 408. Frequency division multiplexing is accomplished by up converting the wideband analog phase-modulated signal obtained at the output of the band pass filter 406 to distinct frequencies in the operational band. For example 1 GHz phase-modulated signal obtained at a first RF channel may be up-converted to 2.4 GHz using a fixed frequency oscillator of 1.4 GHz. Similarly, the 1 GHz phase-modulated signal obtained at a second RF channel may be up converted to 2.404 GHz using a fixed frequency oscillator of 1.404 GHz. The desired frequency phase-modulated signal is drawn through a band pass filter 410. This enables simultaneous transmission of MR data obtained from multiple RF channels but at closely spaced distinct non-overlapping frequencies, which accomplishes frequency division multiplexing (FDM).

As an alternative to up-conversion, carrier signals generated at different frequencies yet spaced apart by a predetermined frequency may be used to achieve frequency division multiplexing. Direct Digital Synthesizers programmed to different output frequencies using a single reference oscillator may be used at each RF channel to serve as a source of the carrier signal, which is modulated in phase and multiplied in frequency. This technique may not require up conversion stages to raise the frequency of the phase-modulated signal, corresponding to each RF channel, to the operational band. A generalized block diagram of this embodiment is illustrated in FIG. 5.

Figure 5:
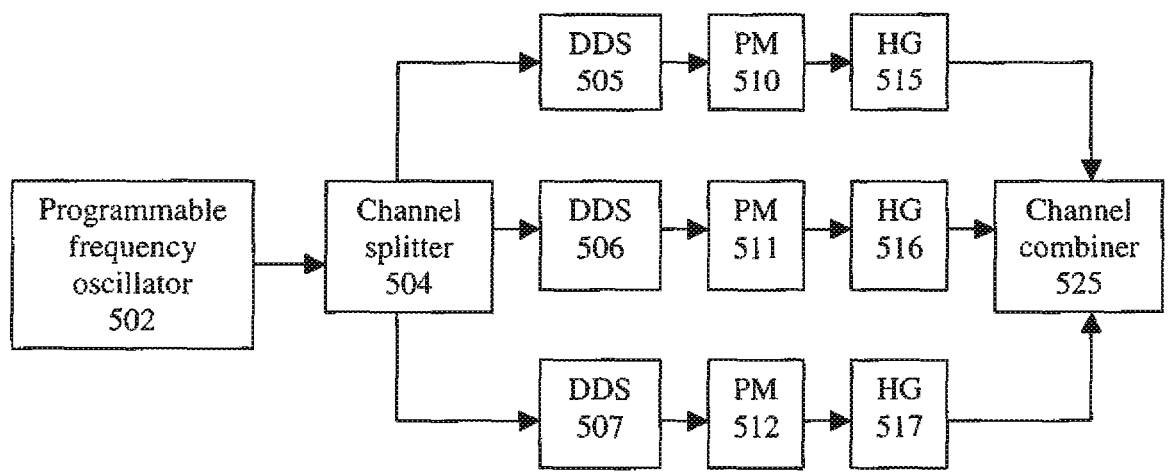
FIG. 5 shows a block diagram of the transmitter as described in another embodiment.

FIG. 5 shows a block diagram of the transmitter 102 depicting multi RF channel wireless MR data transmission system using phase modulation and frequency division multiplexing. The transmitter 102 comprises a phase locked programmable frequency oscillator 502 configured to provide a reference signal in synchronization with the MRI scanner's system clock signal through a pilot carrier. A channel splitter 504 coupled to the programmable frequency oscillator 502 is configured to supply the reference signal to multiple RF channels.

The transmitter 102 further comprises an array of direct digital synthesizers (DDS) 505, 506 and 507 coupled to the RF channel splitter 504. Each DDS in the array of DDS 505, 506 and 507 is associated with a single RF channel and configured to generate a fixed frequency carrier signal based on the reference signal. The fixed frequency carrier signal thus generated is in phase synchronization with the reference signal. The frequency of the fixed frequency carrier signal corresponds to the associated RF channel. The DDS in each RF channel can be programmed to yield a slightly different frequency to provide FDM (Frequency Division Multiplexing). The reference signal from the programmable frequency oscillator 502 (a single Temperature Compensated Crystal Oscillator) facilitates maintaining synchronism between the DDS corresponding to various the RF channels.

An array of modulators 510, 511 and 512 is coupled to the array of DDS 505, 506 and 507. Each modulator in the array of modulators 510, 511 and 512 is coupled to a single DDS and configured to modulate the fixed frequency carrier signal generated at the DDS using the frequency converted MR signal. Further an array of harmonics generators 515, 516 and 517 is coupled to the array of modulators 510, 511 and 512. Each harmonic generator in the array of harmonic generators 515, 516 and 517 is configured to multiply the phase-modulated signal generated at each phase modulator by the first predetermined factor. Upon multiplication, the frequency spacing between the wideband phase-modulated signals generated at each RF channel would be sufficient for an efficient FDM system. The transmitter 102 further comprises a channel combiner 525 configured to combine one or more outputs from the array of harmonic generators 515, 516 and 517.

Further the transmitter 102 may comprise an array of band selection (Band pass) filters (not shown) coupled to the array of harmonic generators 515, 516 and 517. Each band selection filter in the array of band selection filters (not shown) is coupled to a single harmonic generator in the array of harmonic generators 515, 516 and 517. Further, each band selection filter in the array of band selection filters (not shown) is configured to select an appropriate multiple of a fundamental frequency.

The design of the RF module 100 is scalable thereby allowing addition or reduction of the RF channels without affecting the overall system functionality. As shown in FIG. 5, an addition of an RF channel would only require another chain of the elements DDS, PM, HG and BPF. Elimination of an RF channel would only require disconnection of the chain of the elements DDS, PM, HG and BPF and termination of an appropriate port of the channel combiner 525 with a characteristic impedance. The addition or removal of an RF channel can be performed without affecting other RF channels and overall functionality.

The outputs from various RF channels combined using the channel combiner 525 may be fed into a power amplifier (not shown) prior to transmission. A similar architecture may be used in the receiver 104 with frequency synthesizers at each RF channel to select an appropriate down-conversion frequency for demodulation and image reconstruction.

The out put signal from the channel combiner 525 amplified by the power amplifier (not shown) may then be transmitted by means of an antenna. Employing a directional antenna in the transmitter 102 provides an advantage in that the directional antenna prevents the reception of signals reflected from an RF shield leading to multi path distortion effects thereby achieving better line of sight.

The transmitted signal is sensed by the receiver 104 that is spatially separated from the transmitter 102 by a substantial distance, through another directional antenna. The overall block diagram of the receiver 104 is illustrated in FIG. 6.

Figure 6:
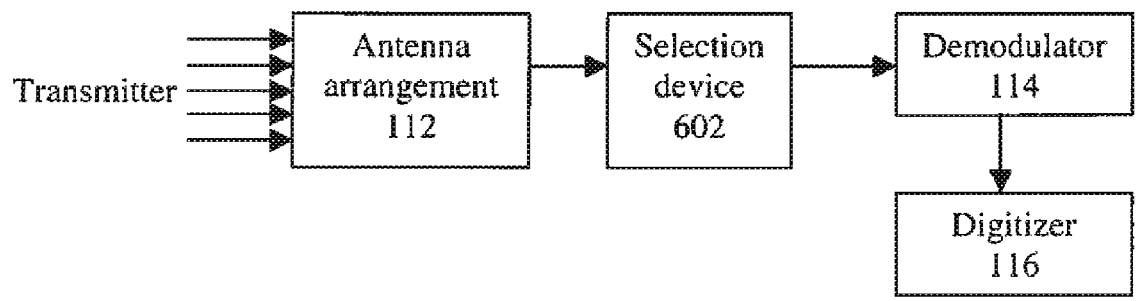
FIG. 6 shows a block diagram representing a receiver in the RF module of the MRI apparatus as described in an embodiment.

With reference to FIG. 6, a typical configuration of the radio frequency receiver 104 is described. The antenna arrangement 112 comprises a plurality of antennas and in order to select a phase-modulated signal received by one of the antennas, the receiver 104 employs a selection device 602. The selection device 602 is configured for selecting a phase-modulated signal, received by one of the antennas, for demodulation.

Figure 7:
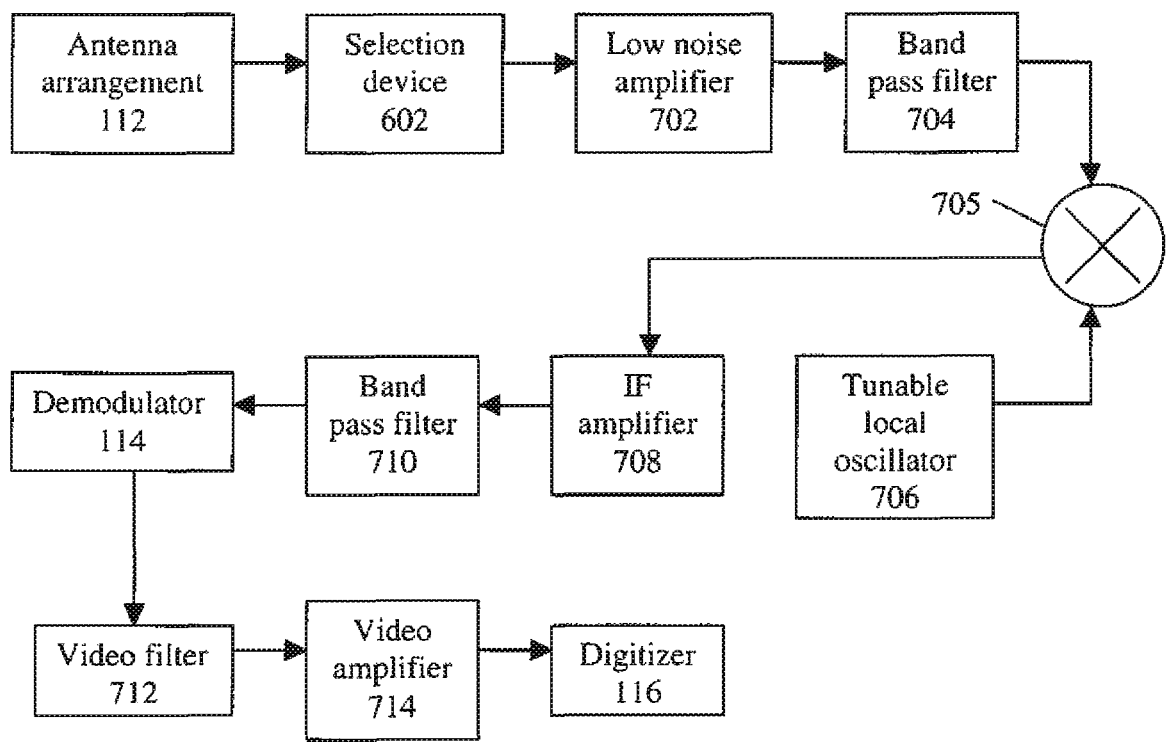
FIG. 7 shows an exemplary block diagram of the receiver shown in FIG. 6.

FIG. 7 shows a detailed and exemplary block diagram of the receiver 104 as described in another embodiment. Those skilled in the art can substitute other receiver components for the described exemplary components. With reference to FIG. 7, the received signal is amplified by means of a low noise amplifier 702 (LNA) and filtered to reject frequencies out of the interested range using a band pass filter 704. The filtered signal is down converted to an intermediate frequency signal having an intermediate frequency of about 70 MHz. Skilled artisans shall however appreciate that other intermediate frequencies may also be used depending on feasibility and design aspects.

Down conversion is performed using a combination of a down conversion mixer 705 and a tunable local oscillator 706. The frequency of the tunable local oscillator 706 may be tuned to approximately 70 MHz over and above the frequency of the phase-modulated signal received. The tunable local oscillator 706 reduces the frequency of phase-modulated signal but preserves the modulation it carries.

The receiver 104 may further comprise an IF amplifier 708 coupled to the down conversion mixer 705. The IF amplifier 708 at the receiver 104 is a variable gain limiting amplifier incorporating Automatic Gain Control (AGC). The IF amplifier 708 comprises a logarithmic amplitude detector whose output controls the gain of the IF amplifier 708. This ensures that a phase-modulated signal of sufficient amplitude is presented to the following stages for demodulation. An amplitude limiter (not shown) in the IF amplifier 708 prevents excess amplification and also eliminates any variation/modulation of the amplitude of the phase-modulated signal thereby making the demodulator 114 insusceptible to amplitude distortions due to RF channel noise, and incidental amplitude modulation (AM) by interfering signals. Further, the amplitude limiter (not shown) when included prior to the down conversion mixer 705 prevents the down conversion mixer 705 from being saturated.

An additional band pass filter 710 coupled to the IF amplifier 708 is configured to obtain an intermediate frequency (IF) signal of 70 MHz. This ensures high fidelity, as the demodulator 114 is only sensitive to changes in the phase of the phase-modulated carrier signal.

The demodulator 114 coupled to the band pass filter 710 may comprise a quadrature detector where the down converted intermediate frequency signal is demodulated to reproduce the MR signal at 2 MHz frequency. The demodulated MR signal is filtered and amplified using a video filter 712 and a video amplifier 714 to eliminate any high frequency noise content, and is presented to the digitizer 116 for image reconstruction.

In addition to the components of the receiver 104 described in conjunction with FIG. 7, an additional low noise amplifier (LNA) (not shown) may be coupled to the combination of the band pass filter 704 (BPF) and the down conversion mixer 705 to improve the overall noise figure of the receiver 104.

Figure 8:
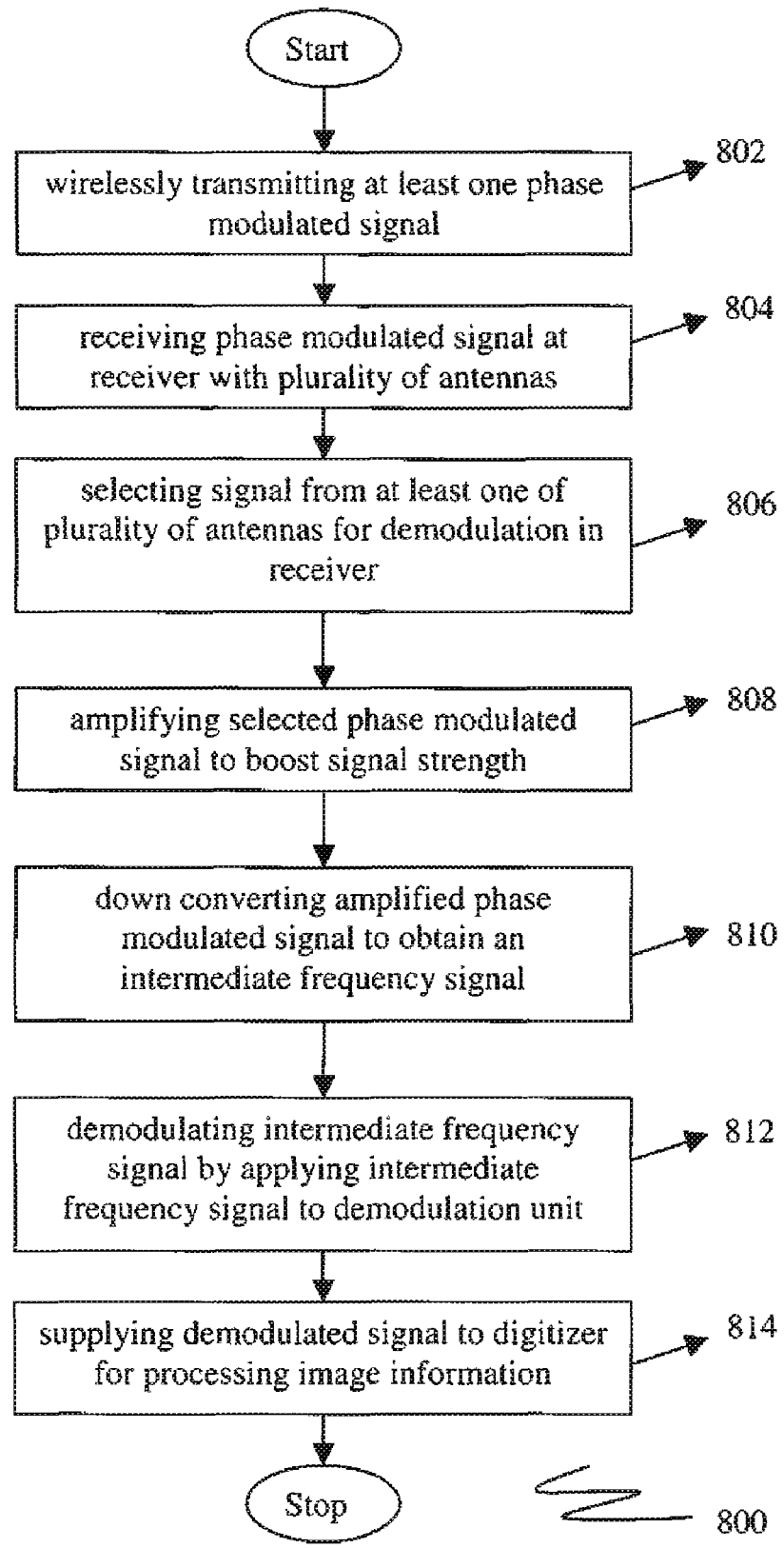
FIG. 8 shows a flow diagram representing a method of communicating MR data as described in one embodiment.

In yet another embodiment, shown in FIG. 8, a method 800 of communicating MR data is provided. The method 800 comprises steps of wirelessly transmitting at least one phase-modulated signal at step 802, receiving the phase-modulated signal at the receiver 104 with a plurality of antennas at step 804, selecting a phase-modulated signal from at least one of the plurality of antennas for demodulation at step 806, amplifying the selected phase-modulated signal to boost signal strength at step 808, down converting the amplified phase-modulated signal to obtain an intermediate frequency signal at step 810, demodulating the intermediate frequency signal by applying the intermediate frequency signal to the demodulator 114 at step 812 and supplying the demodulated signal to the digitizer 116 for processing image information at step 814.

The method 800 further comprises selecting predetermined down conversion frequency for each RF channel for demodulation and image reconstruction. The tunable local oscillator 706 configured for down conversion may be programmed to select an appropriate centre frequency for the oscillator signal generated. The centre frequency may correspond to the RF channel the tunable local oscillator 706 is associated with. The selected frequency gets heterodyned at the down conversion mixer 705 to yield a predetermined intermediate frequency. In an exemplary embodiment, the frequency of the phase-modulated signal corresponding to a selected RF channel is 2.4 GHz and the intermediate frequency is predetermined to be about 70 MHz. In such a scenario, the tunable local oscillator 706 may be programmed to generate an oscillator signal with a frequency of about 2.470 GHZ. Subsequent to the mixing of the phase-modulated signal with the oscillator signal generated by the tunable local oscillator 706, the two signals are multiplied yielding signals at 70 MHz and 4.870 GHz. The intermediate frequency signal, having 70 MHz frequency is drawn through the band pass filter 710 coupled to the down conversion mixer 705.

In yet another embodiment, a computer readable program stored in computer readable media is provided. The computer readable program comprises instructions for executing a method of communicating MR data obtained from the RF coil. The instructions comprise a routine for wirelessly transmitting at least one phase-modulated signal, a routine for sensing the transmitted phase-modulated signal by a receiving antenna, a routine for amplifying the received phase-modulated signal to boost signal strength, a routine for down converting the amplified phase-modulated signal to obtain an intermediate frequency signal, a routine for demodulating the intermediate frequency signal by applying the intermediate frequency signal to the demodulator 114 and a routine for supplying the demodulated signal to the digitizer 116 for processing image information.

Further the routine for wirelessly transmitting at least one phase-modulated signal comprises a routine for obtaining at least one MR signal having the Larmor frequency, from an RF channel in the RF coil, a routine for generating a modulation signal based on the MR signal, a routine for generating a carrier signal with a predetermined frequency, the predetermined frequency being associated with the RF channel and a routine for using the modulation signal to phase modulate the carrier signal to form a phase-modulated signal.

The invention provides a system and method for overcoming the aforementioned problems by providing wireless transmission of MR signals from one or more receive coils of an RF coil to a remotely located receiver. By utilizing wireless telemetry, ghosting and SNR problems typically associated with cabled receive coils are avoided.

More particularly, the RF module described herein enables wireless communication involving wideband analog phase-modulated, time and frequency division multiplexed transmission and reception of MR data. The architecture allows time division multiplexing (TDM) by means of an RF switch array to support applications that require sequential excitation of RF channels to obtain the MR data.

The design of the RF module is scalable thereby allowing addition or reduction of RF channels without affecting the overall system functionality. The RF module described herein can operate in multiple bands in case of addition of more number of RF channels, by programming the DDS to different frequencies and including additional power amplifiers and antennae in the intended additional bands of operation. This would enable addition of more RF channels if desired by the application.

Analog phase modulation when accompanied by frequency multiplication produces desired amount of phase modulation and possesses fidelity of frequency modulation.

The system architecture, modulation techniques and modulation response are independent of the topology and construction methodology of the carrier signal generator. The stability of the carrier frequency is well maintained by isolating the modulation signal from the carrier signal generator's internal frequency tuning elements.

High amount frequency stability of the carrier signal can be maintained as the frequency tuning circuit of the carrier signal generator is not directly affected by modulation and therefore allows employability of high stability oscillators like "TCXO" (Temperature Compensated Crystal Oscillator) thereby eliminating troubles of frequency drift and random frequency switching which are probable to appear in a direct FM system.

Another advantage resides in reducing image distortions introduced by non-linearities, gain instabilities, gain drift, or other imperfections in the receive chain.

The proposed architecture for the RF module provides the fidelity of frequency modulation, high stability, high data integrity, high immunity to interference, negligible latency, modular and scalable architecture, multi RF channel sequential and simultaneous operation, multi band operation, component independent architecture, invulnerability to component obsolescence, cost advantage for multi-RF channel operation, very low susceptibility to RF channel noise, amplitude distortion and non linearities in the transmission medium, easy serviceability, high repeatability and ease of manufacturing in large numbers. Further, the design of the RF module described herein eliminates the need to provide synchronization between the transmitter and the receiver.

In various embodiments of the invention, an RF module for an MRI apparatus and an MRI apparatus using an RF module are described. However, the embodiments are not limited and may be implemented in connection with different applications. The application of the invention can be extended to other areas, for example wireless communication. The invention provides a broad concept of using phase modulation for wireless communication of signals, which can be adapted in a similar communication system. The design can be carried further and implemented in various forms and specifications.

This written description uses examples to describe the subject matter herein, including the best mode, and also to enable any person skilled in the art to make and use the subject matter. The patentable scope of the subject matter is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A method of wirelessly transmitting magnetic resonance (MR) data, the method comprising:
    obtaining at least one MR signal having a Larmor frequency, from a radio frequency (RF) channel in an RF coil, the RF coil comprising multiple RF channels, each RF channel associated with a single imaging element;
    generating a modulation signal based on the MR signal;
    generating a carrier signal with a predetermined frequency, the predetermined frequency being associated with the RF channel; and
    using the modulation signal to phase modulate the carrier signal to form a phase-modulated signal.

2. The method of claim 1, further comprising multiplying the frequency of the phase-modulated signal by a first predetermined factor and wherein the first predetermined factor is in the range of about 1 to 100.

3. The method of claim 1, wherein the predetermined frequency is approximately 100 MHz.

4. The method of claim 1, further comprising selecting an RF channel for transmission using an RF switch array.

5. The method of claim 4, further comprising up converting the phase-modulated signal by a second predetermined factor, the second predetermined factor being associated with the selected RF channel and wherein the second predetermined factor is in the range of about 1 to 100.

6. The method of claim 4, further comprising frequency division multiplexing the phase-modulated signal and wherein the frequency division multiplexing comprises:
    using a programmable frequency oscillator to generate a reference signal; and
    configuring an array of direct digital synthesizers to generate multiple carrier signals based on the reference signal, each carrier signal having a fixed carrier frequency, the fixed carrier frequency representing the selected RF channel.

7. The method of claim 1, further comprising time division multiplexing (TDM) the phase-modulated signal.

8. The method of claim 1, wherein the step of generating the modulation signal comprises:
   converting the MR signal having the Larmor frequency to a frequency-converted signal having an intermediate frequency; and
   using the frequency-converted signal as the modulation signal.

9. The method of claim 8, wherein the intermediate frequency is lower than the Larmor frequency and is approximately in the range of about 1 MHz to 3 MHz.

10. A method of communicating MR data, the method comprising:
   wirelessly transmitting at least one phase-modulated signal;
   receiving the phase-modulated signal at a receiver with a plurality of antennas;
   selecting the phase-modulated signal from at least one of the plurality of antennas for demodulation in the receiver;
   down converting the phase-modulated signal to obtain an intermediate frequency signal;
   demodulating the intermediate frequency signal by applying the intermediate frequency signal to a demodulator; and
   supplying the demodulated signal to a digitizer for processing image information.

11. The method of claim 10, further comprising amplifying the selected phase-modulated signal to boost signal strength and wherein the amplification is performed using a low noise amplifier.

12. The method of claim 10, further comprising selecting predetermined down conversion frequency for each RF channel for demodulation and image reconstruction.

13. A computer readable program stored in computer readable media, the computer readable program comprising instructions for executing a method of communicating MR data, the instructions comprising:
   a routine for wirelessly transmitting at least one phase-modulated signal;
   a routine for sensing the transmitted phase-modulated signal by a receiving antenna; a routine for amplifying the received phase-modulated signal to boost signal strength;
   a routine for down converting the amplified phase-modulated signal to obtain an intermediate frequency signal;
   a routine for demodulating the intermediate frequency signal by applying the intermediate frequency signal to a demodulator; and
   a routine for supplying the demodulated signal to a digitizer for processing image information.

14. The computer readable program product of claim 13, wherein the routine for wirelessly transmitting at least one phase-modulated signal comprises:
   a routine for obtaining at least one MR signal having a Larmor frequency, from an RF channel in an RF coil, the RF coil comprising multiple RF channels, each RF channel associated with a single imaging element;
   a routine for generating a modulation signal based on the MR signal;
   a routine for generating a carrier signal with a predetermined frequency, the predetermined frequency being associated with the RF channel; and
   a routine for using the modulation signal to phase modulate the carrier signal to form a phase-modulated signal.

15. An RF module for an MRI apparatus for communicating MR data, the RF module comprising:
   a transmitter configured for transmitting a phase-modulated signal comprising the MR data, the transmitter comprising:
      an RF switch array configured to support sequential excitation of one or more RF channels to obtain an MR signal;
      a local oscillator coupled to the RF switch array, the local oscillator configured to convert the MR signal obtained at a Larmor frequency to a frequency-converted signal having an intermediate frequency;
      a fixed frequency oscillator configured for generating a carrier signal with a predetermined frequency, the predetermined frequency being associated with the RF channel;
      a modulator coupled to the fixed frequency oscillator and the local oscillator, the modulator configured for phase modulating the carrier signal using the frequency-converted signal to form a phase-modulated signal; and
      a harmonic generator coupled to the modulator, the harmonic generator configured for multiplying the frequency of the phase-modulated signal by a first predetermined factor; and
   a receiver wirelessly connected to the transmitter and configured to receive the phase-modulated signal for subsequent data processing and image reconstruction.

16. The RF module of claim 15, wherein the modulator comprises a phase shifter configured for varying phase of the carrier signal generated at the fixed frequency oscillator using an external voltage controlled phase shift.

17. The RF module of claim 15, wherein the modulator comprises a combination of one or more quadrature coupler and at least one varactor diode.

18. The RF module of claim 15, wherein the modulator comprises a combination of at least one inductor capacitor resonator and at least one varactor diode.

19. The RF module of claim 15, wherein the transmitter further comprises a combination of a mixer and a fixed frequency oscillator for up converting the phase-modulated signal and wherein a control input of the programmable frequency oscillator connected to the modulator is supplied with the modulation signal.

20. The RF module of claim 15, wherein the transmitter comprises an array of fixed frequency oscillators, each fixed frequency oscillator in the array of fixed frequency oscillators associated with a single RF channel and wherein each fixed frequency oscillator generates a fixed frequency carrier signal, the fixed frequency representing the associated RF channel.

21. The RF module of claim 15, wherein the receiver comprises an antenna arrangement in wireless communication with the transmitter for receiving the phase-modulated signal transmitted by the transmitter, the antenna arrangement comprising a plurality of antennas, a demodulator coupled to the antenna arrangement for reacquiring the modulation signal from the received phase-modulated signal and a digitizer comprising a plurality of digital data processing blocks for processing the modulation signal for image reconstruction.

22. The RF module of claim 21, wherein the receiver comprises a selection device for selecting the phase-modulated signal received by one of the antennas for demodulation.

23. The RF module of claim 15 incorporated into the MRI apparatus to wirelessly transmit the MR signal from an RF coil of the MRI apparatus to the receiver, located remotely from the MRI apparatus, the receiver configured for processing and image reconstruction.

24. An RF module for an MRI apparatus for communicating MR data, the RF module comprising:
- a transmitter configured for transmitting a phase-modulated signal comprising the MR data, the transmitter comprising:
  - a programmable frequency oscillator configured to provide a reference signal;
  - a channel splitter coupled to the programmable frequency oscillator, the channel splitter configured to supply the reference signal to multiple RF channels;
  - an array of direct digital synthesizers (DDS) coupled to the channel splitter, each DDS in the array of DDS associated with a single RF channel and further configured to generate a fixed frequency carrier signal based on the reference signal, the fixed frequency corresponding to the associated RF channel;
  - an array of modulators coupled to the array of DDS, each modulator in the array of modulators coupled to a single DDS and configured to modulate the fixed frequency carrier signal generated at the DDS to form a phase-modulated signal;
  - an array of harmonics generators coupled to the array of modulators, each harmonic generator in the array of harmonic generators configured to multiply the phase-modulated signal by a predetermined factor; and
  - a channel combiner coupled to the array of harmonic generators, the channel combiner configured to combine one or more outputs from the array of harmonic generators; and
- a receiver wirelessly connected to the transmitter and configured to receive the phase-modulated signal for subsequent data processing and image reconstruction.

* * * * *